United States Patent
Unterricker

(10) Patent No.: US 6,791,420 B2
(45) Date of Patent: Sep. 14, 2004

(54) PHASE LOCKED LOOP FOR RECOVERING A CLOCK SIGNAL FROM A DATA SIGNAL

(75) Inventor: Reinhold Unterricker, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/461,816

(22) Filed: Jun. 6, 2003

(65) Prior Publication Data

US 2003/0218509 A1 Nov. 27, 2003

Related U.S. Application Data

(63) Continuation of application No. PCT/DE01/04523, filed on Dec. 3, 2001.

(30) Foreign Application Priority Data

Dec. 7, 2000 (DE) .......................................... 100 60 911

(51) Int. Cl.[7] ................................................ H03L 7/00
(52) U.S. Cl. ........................... 331/1 A; 331/25; 331/10; 327/156; 327/158; 327/159; 375/376
(58) Field of Search ........................... 331/1 A, 25, 10; 327/156, 158, 159; 375/376

(56) References Cited

U.S. PATENT DOCUMENTS 3,820,034 A  6/1974 Ball ............................ 327/166
5,081,427 A  1/1992 Suarez ......................... 331/10
6,147,561 A  11/2000 Rhee et al. .................... 331/12
6,433,599 B2  8/2002 Friedrich et al. ............ 327/165

FOREIGN PATENT DOCUMENTS

| DE | 691 13 038 T2 | 2/1993 |
| DE | 198 42 711 A1 | 3/2000 |
| EP | 0 526 573 B1 | 2/1993 |
| EP | 0 556 984 A1 | 8/1993 |
| WO | 91/16766 | 10/1991 |

OTHER PUBLICATIONS

Pottbäcker, A. et al.: "A Si Bipolar Phase and Frequency Detector IC for Clock Extraction up to 8 Gb/s", IEEE Journal of Solid–State Circuits, vol. 27, No. 12, Dec. 1992, pp. 1747–1751.

Lee, T. H. et al.: "A 155–MHz Clock Recovery Delay—and Phase–Locked Loop", IEEE Journal of Solid–State Circuits, vol. SC–27, Dec. 1992, pp. 421–430.

Alexander, J. D. H.: "Clock Recovery from Random Binary Signals", Electronic Letters, vol. 11, No. 22, 1975, pp. 541–542.

*Primary Examiner*—Arnold Kinkead
(74) *Attorney, Agent, or Firm*—Laurence A. Greenberg; Werner H. Stemer; Ralph E. Locher

(57) ABSTRACT

A phase locked loop for recovering a clock signal from a data signal including a delay locked loop with a nonlinear digital phase detector. The delay locked loop that is embedded in the phase locked loop acts like a linear phase detector. The phase locked loop of the present invention can be produced at low cost and is particularly suitable for use in data communication.

12 Claims, 2 Drawing Sheets

PHASE LOCKED LOOP FOR RECOVERING A CLOCK SIGNAL FROM A DATA SIGNAL

CROSS-REFERENCE TO RELATED APPLICATION

This application is a continuation of copending International Application No. PCT/DE01/04523, filed Dec. 3, 2001, which designated the United States and was not published in English.

BACKGROUND OF THE INVENTION

Field of the Invention

The present invention relates to a phase locked loop for recovering a clock signal from a data signal, having a delay locked loop with a phase detector with a first input that is coupled to a connection for supplying a signal that can be derived from the clock signal, and with a second input that is coupled to a connection for supplying the data signal, with an integrator that is connected to one output of the phase detector, and with a delay element that is connected by a control input to one output of the integrator and that is connected on the output side to one of the two inputs of the phase detector, a loop filter that is connected to the output of the integrator, and a voltage controlled oscillator that is connected on the input side to one output of the loop filter and at whose output the clock signal can be tapped off.

Recovery of a clock signal from a received data signal, for example, a binary signal with a random sequence of zeros and ones, is a central problem in data technology and telecommunications technology.

One possible solution approach is to use a phase locked loop with a digital phase detector, which produces an actuating signal for a local oscillator. In such a case, the phase angle of the data signal is compared with the clock phase of the clock signal in a digital phase detector of this type in each case with respect to the flank changes in the data signal, that is to say, the changes from logic 0 to logic 1 and vice-versa The phase detector in such a case produces at its output the information "clock too early", "clock too late", or "clock correct or phase unknown". This signal information is used for keying a frequency of an output signal of a local voltage controlled oscillator (VCO), and, thus, for following the phase angle of the data signal. This principle is specified, by way of example, in the article "Clock Recovery from Random Binary Signals", J. D. H. Alexander, Electronics Letters Vol. 11, No. 22 (1975), pages 541 to 542 as well as in the article "Si Bipolar Phase and Frequency Detector IC for Clock Extraction up to 8 Gb/s", A. Pottbäkker, U. Langmann, IEEE Journal of Solid-State Circuits, Vol. 27, No. 12 (1992), pages 1747 to 1751.

The use of a digital phase detector in a phase locked loop PLL for obtaining a clock signal from a data signal can be implemented quite easily in terms of the circuitry. The digital or nonlinear method of operation of the phase detector is, however, a disadvantage for the transmission system in comparison to a linear method of operation because, in the event of any phase error, only its mathematical sign is known, but not the magnitude of the discrepancy. In consequence, it is not possible to specify a linear transfer function for the system or a modulation bandwidth for the phase modulation. However, because the transmission of data over long distances is a frequent objective in telecommunications technology, in the process of which a large number of signal regenerators have to be connected in series, it is desirable for the circuits used for clock recovery to be linear and to have a well-defined modulation bandwidth.

German Published, Non-Prosecuted Patent Application DE 198 42 711 A1, corresponding to U.S. Pat. No. 6,433,599 to Friedrich et al., discloses a circuit for data signal recovery and for clock signal regeneration in which, in addition to the PLL for clock recovery with a digital phase detector, a second PLL is provided and has a linear, analog phase detector, is connected downstream from the first PLL, and produces an output clock signal from the clock that is produced in the first stage. However, such a circuit requires a second voltage-controlled oscillator with the additional complexity that is associated therewith.

The article "A 155-MHz Clock Recovery Delay- and Phase-Locked Loop", T. H. Lee, J. F. Bulzacchelli, IEEE Journal of Solid-State Circuits, Vol. SC-27, December 1992, pages 1736 to 1746, discloses a circuit of this generic type in which a delay locked loop DLL is combined with a phase locked loop PLL, connected in parallel. It is, thus, possible to achieve very fast clock signal recovery with high performance and good jitter characteristics. The phase detector that is used may, in such a case, assume two or more output values, for example, five output values, which are integrated in a loop integrator to form a triangular waveform signal.

The loop filter in the control loop that is described in the article has a pure integrator without any proportional component, see FIG. 9, with the function $H_f=K_D/s$. The output of this loop filter is connected to a voltage-controlled oscillator VCO. This VCO must be a high-precision crystal oscillator (VCXO), whose frequency differs only insignificantly from the data rate. Any difference between the oscillator frequency and the data rate of the data signal must be compensated for by a steady-state actuating value for the loop filter, which also controls the controllable delay element. This restricts the phase control range of the delay loop, as is explained in the Chapter "C. Acquisition Behavior of the D/PLL".

The described D/PLL is configured by the two poles of the phase transfer function (jitter transfer function) H(s), see Chapter B, which can be adjusted by the DLL parameters $K_D$ and $K_\Phi$ as well as the PLL parameter $K_0$. However, linear components, in particular, a linear phase detector with a defined detector constant $K_D$, are required for correct configuration of this linear function. This phase detector must be able to make a quantitative statement relating to the phase error, in addition to a qualitative statement.

SUMMARY OF THE INVENTION

It is accordingly an object of the invention to provide a phase locked loop for recovering a clock signal from a data signal that overcomes the hereinafore-mentioned disadvantages of the heretofore-known devices of this general type and that makes possible a linear phase locked loop whose design has been simplified further.

A clock signal normally has a predefined known sequence of binary coded series of zeros and ones, which, normally, also alternate.

In contrast, a data signal carries coded information that, for example, is not known a priori to a receiver, such as speech data, text data, graphics data or other data. Thus, even if the use of a scrambler makes it possible to achieve an equal probability of the occurrence of zeros and ones when averaged over a lengthy time period, it is not necessary to know, for example, at the receiver the clock information on which the data signal is based. In consequence, the recovery of a clock signal from a data signal is of major importance in information and communications technology.

With the foregoing and other objects in view, there is provided, in accordance with the invention, a phase locked loop for recovering a clock signal from a data signal, including a delay locked loop having a connection for supplying a signal to be derived from the clock signal, a connection for supplying the data signal, a nonlinear phase detector having a first input coupled to the connection for supplying the signal, a second input coupled to the connection for supplying the data signal, and at least one output, the nonlinear phase detector producing, at the at least one output, one of a signal able to assume one of only three states including a first state in which a phase of the clock signal leads a phase of the data signal, a second state in which the phase of the clock signal lags the phase of the data signal, and a third state in which a phase angle of the clock signal and a phase angle of the data signal one of match and are instantaneously unknown, and a binary signal, an integrator having an output and an input connected to the at least one output of the phase detector, and a delay element having a control input connected to the output of the integrator and an output connected to one of the first and second inputs of the phase detector, a loop filter having an output, an input connected to the output of the integrator, a proportional regulator component, and an integral regulator component, and a voltage controlled oscillator having an input connected to the output of the loop filter and an output at which the clock signal is to be tapped off.

According to the invention, a phase locked loop for recovering a clock signal from a data signal is provided and is developed such that the phase detector is a nonlinear phase detector.

The nonlinearity or digitality of the phase detector is distinguished, in particular, in that, although the phase detector makes a qualitative statement as to whether the phase error between two input signals is positive or negative, it does not make any quantitative statements on the magnitude of this phase error. Such phase detectors are also referred to as "bang—bang detectors." They are distinguished, in particular, in that their circuitry can be configured with a relatively low level of complexity.

The output of the phase detector may, in this case, produce a signal that, for example, can assume three values, namely, clock too early, clock correct, or clock too late, depending on whether the phase angle of the clock signal leads or lags that of the data signal, matches it, or is instantaneously not known. A signal such as this at the output may be a ternary signal, which has a positive value when the phase difference has a positive mathematical sign, a negative value when the phase difference has a negative mathematical sign, or the value zero when the phase difference is zero or cannot be determined at that time. The signal at the output, however, does not provide any quantitative statement about the magnitude of the phase difference.

Alternatively, a binary signal can be produced at the output of the phase detector, providing either a logic zero or a logic one depending on whether the phase difference has a positive or negative mathematical sign.

This combines the advantages of the PLL combined with a DLL, which allows high performance, with the advantages of simple configuration and simple implementation of a digital phase detector. The delay locked loop DLL with the digital phase detector as well as the integrator and the delay element that may be configured to be controllable in this case, overall, represents a circuit element whose electrical characteristics correspond to those of a linear, analog phase detector.

According to the present principle, a nonlinear phase detector is used to compare a data signal that arrives in the circuit with a clock signal. In such a case, either the data signal or the clock signal is supplied to the phase detector with a delay. The phase detector may produce an actuating signal, for example, a ternary actuating voltage at its output, which is used to drive an integrator that is connected downstream from the digital phase detector. To form a DLL, the output of the integrator is connected to a delay element that is located either in the data path or in the clock signal path, on the input side of the digital phase detector. The delay element may, in this case, be in the form of a controlled delay element. In such a case, the delay is controlled by the signal that is produced at the output of the integrator.

This control loop forms a delay locked loop DLL. In this case, either the clock phase is slaved to the data phase or the data phase is slaved to the instantaneous clock phase in a nonlinear, very fast, control process. The output signal from the DLL that is produced at the output of the integrator in this case depends in a linear form on discrepancies between the clock phase and the data signal phase, provided that the delay element that is connected to one input of the digital phase detector has a linear characteristic.

In the phase locked loop, the signal that is produced at the output of the integrator is, now, filtered in a loop filter that is connected downstream from the integrator, and controls a voltage controlled oscillator that is connected downstream from the loop filter. The loop filter may, in such a case, have a proportional component, which can be used to configure the bandwidth of the PLL, and an integral component, with which the remaining control error between the data signal phase and the clock signal phase can be made to be equal to zero, or can be made as small as possible.

In accordance with another feature of the invention, the loop filter that is connected downstream from the integrator has a proportional regulator component. This proportional component is used for the actual phase control process. However, to produce a second order phase transfer function in the proposed configuration, the loop filter has an integral component, which introduces the second pole of the transfer function, rather than using the delay loop. In such a case, the integration constant of the integrator is negligibly small. Because time processes in the delay locked loop are always negligibly short in such a case, the phase detector does not need to have a linear response. It is, thus, possible to use a simpler, nonlinear phase detector.

The two poles of the phase transfer function in the present configuration can be configured using the parameters of the phase locked loop without any defined or linear output value of the phase detector being required for such a purpose.

The phase transfer function of one preferred embodiment of the invention is, in this case:

$$H(s) = \frac{1}{1 + s \cdot \frac{K_r}{K_0 \cdot F} + s^2 \cdot \frac{T}{K_0 \cdot K_d \cdot F}}$$

where F is the transfer function of the loop filter, $K_r$ is the conversion gradient of the delay element (phase/voltage), $K_0$ is the conversion gradient of the voltage controlled oscillator (circular frequency/voltage), $K_d$ is the phase detector constant (voltage/phase), s is the complex circular frequency, and T is the integration time constant of the integrator.

If the integration time constant T is assumed to be negligibly short, this results in the phase transfer function H(s) becoming $$H(s) = \frac{1}{1 + s \frac{K_r}{K_0 \ F}}$$

This does not include the detector constant $K_d$, in contrast to the phase transfer function $K_{classical}(s)$ of a conventional PLL:

$$H_{classical}(s) = \frac{1}{1 + s \cdot \frac{K_r}{K_0 \cdot K_d \cdot F}}$$

As in classical PLL theory, H(s) in the present configuration is second order if the transfer function F is a first-order piecewise rational function, that is to say, it has an integral component. With the proposed configuration $K_D$, which is undefined for a nonlinear or bang—bang phase detector, can be replaced by the expression $1/K_\tau$ for configuration purposes, with the second-order control loop being configured as a linear system even though the phase detector is nonlinear.

A further advantage of a loop filter with an integral component is that any discrepancy between the VCO frequency and the data rate of the data signal can be compensated for by this integral component. After completion of such a control process, the delay locked loop can be operated with the same drive range as that which is possible without any frequency error. There is, therefore, no need for a high-precision crystal oscillator. In fact, it is even possible to use a voltage-controlled oscillator VCO that can be tuned over a wide range. This is important, especially for high data rates in the Gigahertz range, because it is impossible to produce crystal oscillators for such high frequencies.

In accordance with a further feature of the invention, the delay element is connected between the connection for supplying the data signal and the second input of the phase detector. The configuration of the delay element in the data path is one possible implementation of the proposed principle, which allows a particularly simple circuit configuration.

In accordance with an added feature of the invention, in which the delay element is disposed in the data path, one data input of the delay element is connected to the output of the integrator, in order to control it.

In accordance with an additional feature of the invention, the delay element is connected between the output of the voltage controlled oscillator and the input of the phase detector. The delay element is, in such a case, disposed in the clock path of the circuit.

In accordance with yet another feature of the invention, if the delay element is disposed in the clock path, it is connected to the output of the integrator, in order to control it.

In accordance with yet a further feature of the invention, if the delay element is disposed in the clock path, a further delay element is connected to the output in order to provide a clock output signal. In such a case, it is advantageous for the delay element of the further delay element to be shorter than a lower limit of an adjustment limit of the delay time of the delay element in the clock path.

In accordance with yet an added feature of the invention, if the delay element is disposed in the clock path, a matching cascade circuit having at least one matching delay element is provided for the phase detector and integrator, for matching the data signal phase to the phase angle of the signal that can be tapped off at the oscillator. In consequence, the tolerance range with regard to jitter can be extended as far as the limits that are set by the fast delay locked loop.

In accordance with a concomitant feature of the invention, the integrator is in the form of a low-pass filter.

Other features that are considered as characteristic for the invention are set forth in the appended claims.

Although the invention is illustrated and described herein as embodied in a phase locked loop for recovering a clock signal from a data signal, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
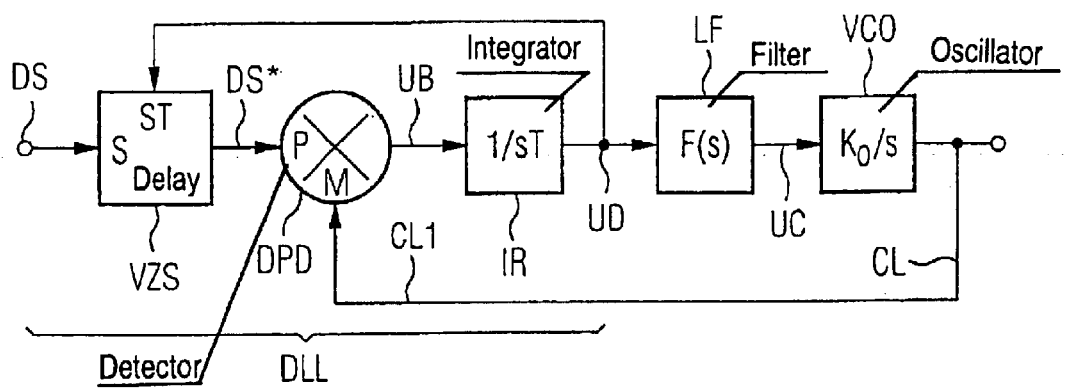
FIG. 1 is a block circuit diagram of a first exemplary embodiment of the circuit according to the invention with a controllable delay element in the data path.

Referring now to the figures of the drawings in detail and first, particularly to FIG. 1 thereof, there is shown a phase locked loop for recovering a clock signal CL from a data signal DS. A voltage controlled delay element VZS with a signal input S and a control input ST is used to convert the data signal DS to a delayed data signal DS*, which is supplied to the positive input P of a digital phase detector DPD. The clock signal CL is supplied to a further, negative input, denoted M, of the digital phase detector DPD. An actuating voltage UB can be tapped off at one output of the digital phase detector DPD, and provides a voltage value as a function of the phase angles between the input signals. The actuating voltage UB is, in this case, a ternary voltage that, for example, assumes a positive voltage value when the phase angle of the data signal DS* is too early with respect to the phase angle of the clock signal CL, assumes a negative value when it is too late, and assumes the value zero when the phase angles match one another or no information can be obtained from the data signal because there are no flank changes in the data signal DS. An integrator IR, whose time constant is T, is connected to the output of the digital or nonlinear phase detector DPD. This time constant T is, in this case, set such that a mean voltage UD is produced at the output of the integrator IR, which is, in each case, smoothed over a number of data bits of the data signal DS. The mean voltage UD is used to control the voltage controlled delay element VZS by supplying it to the control input ST of the delay element VZS. With the definition of the actuating voltage UB as stated above, by way of example, the mean voltage UD acts on the delay element VZS such that its delay element increases as the magnitude of the mean voltage UD increases. In consequence, a leading phase of the data signal DS is increasingly delayed, so as to compensate for this lead. The circuitry including the digital phase detector DPD, integrator IR, and controllable delay element VZS forms a delay locked loop DLL. In such a case, the phase angle of the delayed data signal DS* is slaved to the phase of the clock signal CL in a nonlinear control process, which is, in this case, very fast. The mean voltage UD that is produced at the output of the integrator IR depends on the discrepancy between the phase of the data signal DS and the phase angle of the clock signal CL. If the voltage controlled delay element VZS has a linear characteristic, then fluctuations in the phase angle of the data signal DS with respect to the phase angle of the clock signal CL are transferred in a linear manner to the mean voltage UD.

A loop filter LF is, furthermore, connected to the output of the integrator IR, and a voltage controlled oscillator VCO is connected to the output of the loop filter so that the mean voltage UD can be used in a phase locked loop to control the frequency of a signal that can be tapped off at the output of the voltage controlled oscillator VCO. The output signal from the voltage controlled oscillator VCO is actually the clock signal CL that is supplied to the first input of the digital phase detector DPD. The loop filter LF has a transfer function F(s) that has a proportional component and an integral component. The proportional regulator component can be adjusted to adjust the bandwidth of the phase locked loop. The proportional component and integral component can also be configured such that the residual control error between the phase angle of the clock signal CL and the phase angle of the data signal DS* is zero.

The settling time of the delay locked loop DLL can be set such that it is short in comparison to the settling time of the higher-level phase locked loop. The integration time constant T of the integrator IR can be chosen to be correspondingly short. On the other hand, the integration time constant T should be chosen to be sufficiently long that the mean voltage UD is smoothed over a number of period durations of the data signal without in the process governing the control processes of the higher-level phase locked loop.

In consequence, in the present exemplary embodiment, a nonlinear digital phase detector DPD is disposed in a delay locked loop DLL, with a linear, analog signal being produced at the output of the integrator IR in the delay locked loop DLL, as a measure of the instantaneous control error between the phase angles of the clock signal CL and of the data signal DS. Such a digital phase detector DPD can be produced to be particularly simple. The loop filter LF is a filter that has a proportional component and an integral component so that the clock phase can be slaved to the phase angle of the data signal without any residual control error.

Figure 2:
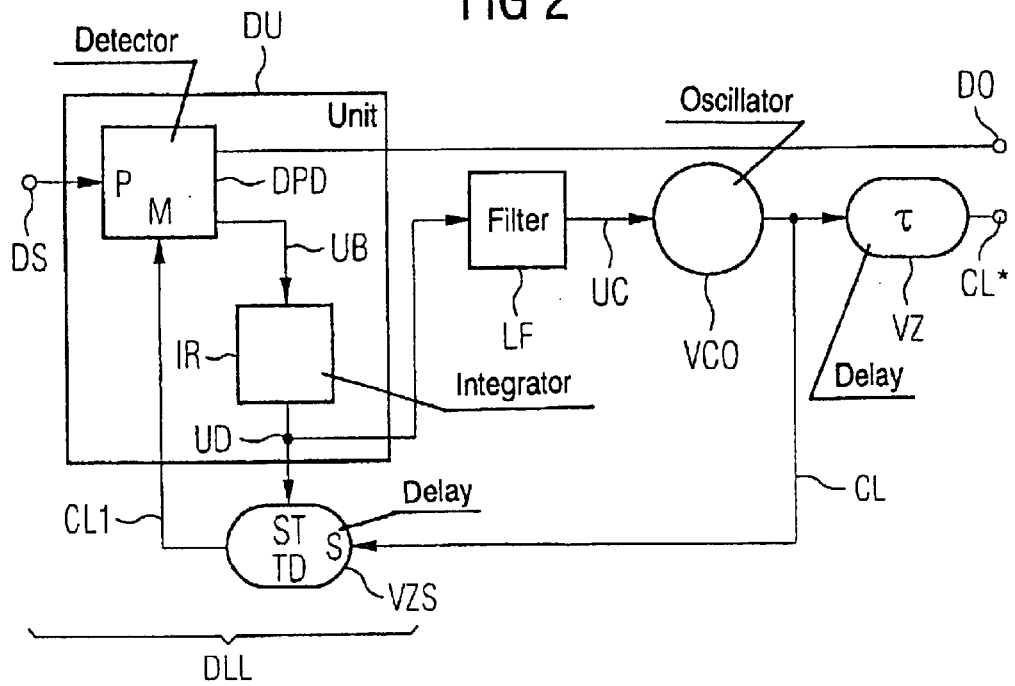
FIG. 2 is a block circuit diagram of a second exemplary embodiment of the circuit according to the invention with a controllable delay element in the clock path.

FIG. 2 shows a block diagram of an alternative embodiment of the phase locked loop for recovering a clock signal CL from a data signal DS. In this case, and in contrast to the phase locked loop shown in FIG. 1, the voltage controlled delay element VZS is not disposed in the data path, but in the clock path. The data signal DS is, accordingly, supplied directly to one of the inputs of the digital phase detector DPD, namely the positive input P, and the voltage controlled delay element VZS delays the clock signal CL that can be supplied to the digital phase detector DPD by a time delay TD so that a delayed clock signal CL1 is supplied to the digital phase detector DPD. As in the first exemplary embodiment, the mean voltage UD is applied to the control input ST of the voltage controlled delay element VZS to control the time delay TD. The mean voltage UD is also passed through a loop filter LF to drive a voltage-controlled oscillator VCO, at whose output the clock signal CL is produced. A further delay element VZ, which is connected to the output of the voltage controlled oscillator VCO and has a time delay τ produces a clock output signal CL*, which corresponds to a data output signal D0 that can be tapped off from the digital phase detector DPD. The digital phase detector DPD and the integrator IR are combined to form a detector unit DU.

As shown in FIG. 1, the actuating voltage is a ternary voltage, whose voltage value carries the information clock too early, clock correct, or clock too late. The mean voltage UB in this case depends on the phase angle of the data signal DS relative to the phase angle of the delayed clock signal CL1. The mean voltage UD corresponds to a smoothed actuating voltage UB, which is constant, or virtually constant, over a number of data bits of the data signal DS. The mean voltage UD is used to set the time delay TD of the voltage controlled delay element VZS. The delay loop DLL shown in FIG. 2, which includes the digital phase detector DPD, the integrator IR, and the voltage controlled delay element VZS, follows the phase of the delayed clock signal CL1 in a nonlinear manner, but follows the phase angle of the data signal DS very quickly. In contrast, slow fluctuations in the data phase are transferred linearly to the mean voltage UD, with the voltage controlled delay element VZS having a linear characteristic. This eliminates the nonlinear characteristics of the phase detector DPD because the phase difference that can be identified by the digital phase detector is very quickly reduced to zero in the delay locked loop DLL.

The mean voltage signal UD that can be produced by the delay locked loop DLL at the output of the integrator IR and that is proportional to phase fluctuations in the data signal DS with respect to the clock signal CL1, drives a voltage controlled oscillator VCO through a loop filter LF.

In comparison to the phase locked loop shown in FIG. 1, the phase locked loop shown in FIG. 2 has the advantage that a voltage controlled delay element VZS that is inserted into the clock path can be produced with simpler circuitry than one disposed in the data path.

Figure 3:
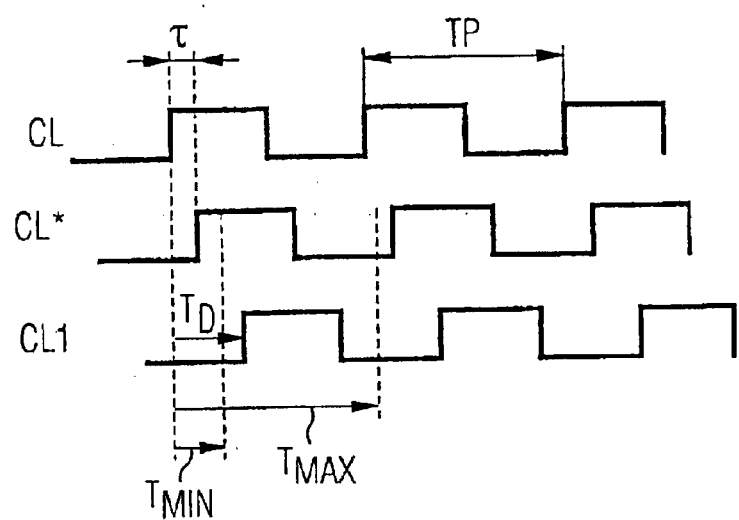
FIG. 3 is a signal timing diagram illustrating signal waveforms of the clock signals of the circuit of FIG. 2.

FIG. 3 shows the clock signal waveforms of the clock signals from FIG. 2. The diagram of FIG. 3 shows the clock signal CL that can be tapped off at the output of the voltage controlled oscillator VCO, the clock output signal CL*, and the clock signal CL1, which is delayed by the time delay TD by the voltage controlled delay element VZS. The time delay of the clock output signal CL* with respect to the clock signal CL is annotated τ. The time delay TD can be adjusted in a limited range, in an interval with the interval boundaries $T_{MIN}$ to $T_{MAX}$. The interval boundaries $T_{MIN}$, $T_{MAX}$ are subject to the following conditions: the minimum delay time $T_{MIN}$ must be longer than the time delay τ of the further delay element VZ; and $T_{MAX}$ must be shorter than the sum of the time delay τ and the period duration of the oscillator signal TP. If flipflops, which have significant set and hold times, are used for the circuit, then these set and hold times must be taken into account when setting the conditions for the interval boundaries of the delay times TD.

Figure 4:
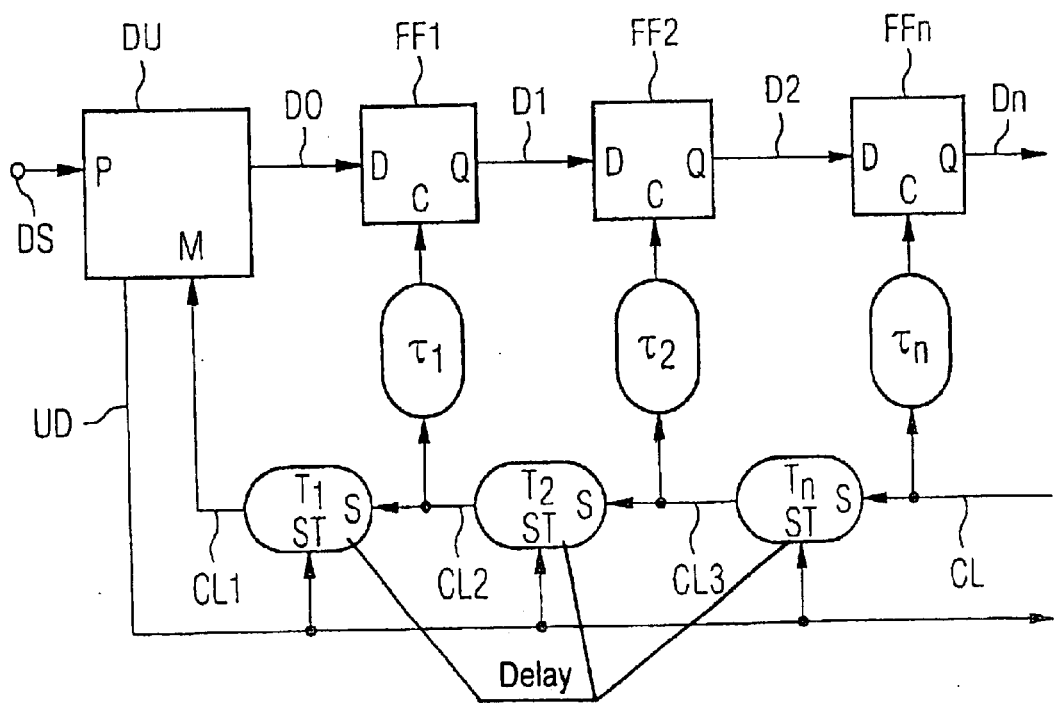
FIG. 4 is a block circuit diagram of an alternative configuration of the phase locked loop of FIG. 2 with a matching cascade circuit.

FIG. 4 shows a matching cascade circuit, which can be connected to the detector unit DU shown in FIG. 2. The matching cascade in this case has two or more delay elements T1 to Tn and $τ_1$ to $τ_n$, by which the phase angle of the data signal DS can be successively matched to the phase angle of the clock signal CL at the output of the oscillator VCO. In such a case, delay elements with a fixed delay time $τ_1$ to $τ_n$ are provided on one hand, and delay elements with a variable delay time T1 to Tn are provided on the other hand. The reference symbols $τ_k$ (k=1 ... n) and $T_k$ (k=1 ... n) in this case denote not only the corresponding components but also the delay time of the respective component.

The condition $τ_{k-1}+T_k \geq τ_k$ must be satisfied for a matching cascade circuit that is operating without any error so that the kth flipflop is triggered before or together with the (k−1)th flipflop, as is the case in the normal shift registers.

In consequence, the minimum delay time of a delay element is given by: $T_{kmin} \geq \tau_k - \tau_{k-1}$. The maximum delay time of a delay element is $T_{MAX} = TP + \tau_k - \tau_{k-1}$. If the data interval is fully utilized, then $T_{MAX} = TP + T_{MIN}$. It follows from this that the delay time of a delay element $T_k$ may, at most, cover a period duration TP, for example, from $T_{kmin}$ to $T_{kmin} + TP$. The tolerance of the phase locked loop to jitter is, accordingly, increased to n times $2\pi$ for n cascade changes. In this case, however, the set and hold times of the flipflops FF1 to FFn, which are connected to the delay elements τ1 to τn have been ignored. The delay elements with an adjustable delay time $T_1$ to $T_n$, in FIG. 4 replace the controllable delay element VZS in FIG. 2. The mean voltage UD controls the delay times of all the controllable delay elements $T_1$ to $T_n$, in FIG. 4. The output of the oscillator VCO in FIG. 2 is connected to the input of both the controlled delay element $T_n$ and of the uncontrolled delay element $\tau_n$. The output of the controlled delay element $T_1$, at which the delayed clock signal CL1 is produced, is connected to the digital phase detector DPD in the detector unit DU. The controlled delay elements $T_1$ to $T_n$, are connected in series. The clock input C of a flipflop FFK, (k=1 . . . n) is connected to the output of the respective uncontrolled delay element $\tau_k$. The flipflops FFk are connected in series with one another, with the data input D of the first flipflop FF1 being connected to the data output D0 of the detector unit DU, and a data output signal $D_n$ can be produced at the data output Q of the n-th flipflop FFn.

The matching cascade circuit shown in FIG. 4 allows the data output signals at the output of the digital phase detector DPD to follow even major phase modulations of the input data signal DS, at frequencies above the configured PLL bandwidth, as a function of the speed of the delay locked loop DLL.

I claim:

1. A phase locked loop for recovering a clock signal from a data signal, comprising:
    a delay locked loop having:
        a connection for supplying a signal to be derived from the clock signal;
        a connection for supplying the data signal;
        a nonlinear phase detector having:
            a first input coupled to the connection for supplying the signal;
            a second input coupled to the connection for supplying the data signal; and
            at least one output;
        said nonlinear phase detector producing, at said at least one output, one of:
            a signal able to assume one of only three states including:
                a first state in which a phase of the clock signal leads a phase of the data signal;
                a second state in which the phase of the clock signal lags the phase of the data signal; and
                a third state in which a phase angle of the clock signal and a phase angle of the data signal one of match and are instantaneously unknown; and
            a binary signal;
        an integrator having:
            an output; and
            an input connected to said at least one output of said phase detector; and
        a delay element having:
            a control input connected to said output of said integrator; and
            an output connected to one of said first and second inputs of said phase detector;
    a loop filter having:
        an output;
        an input connected to said output of said integrator;
        a proportional regulator component; and
        an integral regulator component; and
    a voltage controlled oscillator having:
        an input connected to said output of said loop filter; and
        an output at which the clock signal is to be tapped off.

2. The phase locked loop according to claim 1, wherein said delay element is connected between the connection supplying the data signal and said second input of said phase detector.

3. The phase locked loop according to claim 2, wherein said output of said integrator is connected to said delay element for controlling said delay element.

4. The phase locked loop according to claim 1, wherein said delay element is connected between said output of said voltage controlled oscillator and said first input of said phase detector.

5. The phase locked loop according to claim 4, wherein said output of said integrator is connected to said delay element for controlling said delay element.

6. The phase locked loop according to claim 5, further comprising a second delay element connected to said output of said oscillator and providing a clock output signal.

7. The phase locked loop according to claim 4, further comprising a matching cascade circuit connected to said digital phase detector and to said integrator, said cascade circuit having at least one control delay element for matching a phase angle of a data output signal.

8. The phase locked loop according to claim 5, further comprising a matching cascade circuit connected to said digital phase detector and to said integrator, said cascade circuit having at least one control delay element for matching a phase angle of a data output signal.

9. The phase locked loop according to claim 6, further comprising a matching cascade circuit connected to said digital phase detector and to said integrator, said cascade circuit having at least one control delay element for matching a phase angle of a data output signal.

10. The phase locked loop according to claim 1, wherein said integrator is a low-pass filter.

11. The phase locked loop according to claim 6, wherein:
    said delay element has an adjustable time delay with a lower limit; and
    said second delay element has a delay shorter than said lower limit of said adjustable time delay.

12. The phase locked loop according to claim 6, wherein:
    said delay element has an adjustable time delay with a lower limit; and
    said second delay element has a delay element with a delay shorter than said lower limit of said adjustable time delay.

* * * * *

UNITED STATES PATENT AND TRADEMARK OFFICE
CERTIFICATE OF CORRECTION

PATENT NO.    : 6,791,420 B2
DATED         : September 14, 2004
INVENTOR(S)   : Reinhold Unterricker It is certified that error appears in the above-identified patent and that said Letters Patent is hereby corrected as shown below:

Column 10,
Line 1, should read -- an input connected to said at least one output of said nonlinear --.
Line 7, should read -- inputs of said nonlinear phase detector; --.
Line 18, should read -- supplying the data signal and said second input of said nonlinear phase --.
Line 25, should read -- voltage controlled oscillator and said first input of said nonlinear phase --.
Lines 35, 40 and 45, should read -- nonlinear phase detector and to said integrator, said matching cascade --.

Signed and Sealed this

Twenty-fourth Day of January, 2006

JON W. DUDAS
*Director of the United States Patent and Trademark Office*